(12) United States Patent
Koh

(10) Patent No.: US 7,294,853 B2
(45) Date of Patent: Nov. 13, 2007

(54) SUBSTRATE FOR MOUNTING A SEMICONDUCTOR

(75) Inventor: Liang Kng Ian Koh, Singapore (SG)

(73) Assignee: Infineon Technologies, A.G., Munich (DE)

( * ) Notice: Subject to any disclaimer, the term of this patent is extended or adjusted under 35 U.S.C. 154(b) by 608 days.

(21) Appl. No.: 10/473,454

(22) PCT Filed: Apr. 6, 2001

(86) PCT No.: PCT/SG01/00058

§ 371 (c)(1),
(2), (4) Date: Mar. 1, 2004

(87) PCT Pub. No.: WO02/080644

PCT Pub. Date: Oct. 10, 2002

(65) Prior Publication Data

US 2004/0135266 A1    Jul. 15, 2004

(30) Foreign Application Priority Data

Mar. 30, 2001   (SG) ................... PCT/SG01/00046

(51) Int. Cl.
 H01L 23/48   (2006.01)
 H01L 21/607  (2006.01)
 H01L 23/13   (2006.01)
 G01R 27/08   (2006.01)
 G01R 31/26   (2006.01)

(52) U.S. Cl. .......... 257/48; 257/E23.07; 257/E34.004; 257/E21.504; 257/E21.518; 257/E21.525; 257/782; 257/783; 257/786; 257/676; 257/784; 257/668; 438/15; 438/17; 324/691; 324/763; 324/765

(58) Field of Classification Search ........ 257/E23.004, 257/E23.07, E21.504, E21.518, E21.525, 257/782–784, 786, 48, 676, 668; 438/15, 438/17; 324/691, 763, 765
See application file for complete search history.

(56) References Cited

U.S. PATENT DOCUMENTS

| 4,859,189 | A   | 8/1989 | Petersen et al. |
| 4,967,142 | A   | 10/1990 | Sauerwald et al. |
| 5,138,436 | A   | 8/1992 | Koepf |
| 6,184,576 | B1  | 2/2001 | Jones et al. |
| 6,373,348 | B1* | 4/2002 | Hagerup .................. 333/81 A |
| 6,853,202 | B1* | 2/2005 | Chang et al. .............. 324/691 |

FOREIGN PATENT DOCUMENTS

| JP | 4133341  | A | 5/1992 |
| JP | 7211814  | A | 8/1995 |
| JP | 10056108 | A | 2/1998 |
| JP | 10214849 | A | 8/1998 |

* cited by examiner

Primary Examiner—Alexander Oscar Williams
(74) Attorney, Agent, or Firm—Senniger Powers

(57) ABSTRACT

A substrate (1) is formed from a non-electrically conducting material and is for mounting a semiconductor chip (10). The substrate has a semiconductor chip mounting portion (6). A number of first electrically conducting contact portions (5) are formed on the surface of the material and associated with the mounting portion (6). A second electrically conducting contact portion (3) is formed on the surface of the material, and the second electrically conducting contact portion (3) is adapted to be coupled to testing equipment. A number of electrically conducting paths (4) are formed on the surface of the material. The conducting paths (4) electrically connect the second electrically conducting contact portion (3) to a minority of the first electrically conducting contact portions (5).

18 Claims, 3 Drawing Sheets

SUBSTRATE FOR MOUNTING A SEMICONDUCTOR

CROSS-REFERENCE TO RELATED APPLICATIONS

This application claims priority to International Application No. PCT/SG01/00046 filed Mar. 30, 2001 entitled "A SUBSTRATE FOR MOUNTING A SEMICONDUCTOR CHIP."

BACKGROUND

Technical Field

This invention relates to a substrate, and especially a non-conductive substrate, for mounting a semiconductor chip.

The advantage of using an electrically non-conducting substrate for mounting semiconductor chips (or dies) is that it is possible to form the electrically conducting contacts (or bondfingers), to which the input/output pads of the die are connected, in any position on the surface of the substrate and the contacts are insulated from each other by virtue of the non-conductive nature of the substrate. This contrasts with a conventional metal lead frame, in which the electrical contact needs to be electrically isolated by removing material from the lead frame so as to form an air gap which electrically insulates adjacent contacts.

Each input/output pad (or bond pad) of the die is electrically connected to a corresponding bondfinger by a metal wire that is bonded using a wire bonding machine, between each of the bond pad and the bondfinger. With a non-conductive substrate, the testing of the bonds is usually performed by means of an electrically conducting contact surface usually located on an edge of the substrate. This contact surface corresponds to the mold gate in a subsequent molding operation, and so is sometimes referred to as the mold gate. The mold gate is clamped in the wire bonder and forms an electrical connection with the wire bonder to permit the bonds to be tested during the wire bonding operation.

The mold gate is connected to each of the bondfingers by electrically conducting paths (or traces) formed on the surface of the substrate. As there can be in excess of a hundred separate bondfingers for one semiconductor chip, this requires a corresponding number of traces to connect all the bondfingers to the mold gate.

One of the problems with this arrangement is that where the chip is a wireless communication chip such as a radio frequency (RF) chip, these traces can act as antennae that may adversely affect the operation of the RF chip. Therefore, for a RF chip design, it is preferable not to have traces extending from the bondfingers to the mold gate. However, this results in the problem that it is not possible to test the wire bonds during the wire bond operation.

SUMMARY

In accordance with the present invention, a substrate comprising a non-electrically conducting material for mounting a semiconductor chip comprises a semiconductor chip mounting portion, a number of first electrically conducting contact portions formed on the surface of the material and associated with the mounting portion, a second electrically conducting contact portion formed on the surface of the material, the second electrically conducting contact portion being adapted to be coupled to wire bonding apparatus, and a number of electrically conducting paths formed on the surface of the material to electrically connect the second electrically conducting contact portion to a minority of the first electrically conducting contact portions.

An advantage of the invention is that by forming an electrically conducting path between the second contact portion and a minority of the first contact portions, it is possible to test the bonds on the contact pad on the die and the first electrically conducting contact surfaces, as in most the chip designs, each bond pad on the chip is electrically coupled to the other pads, for example via transistor, while reducing the antennae effect of the paths on a wireless communication packaged device.

Typically, less than 10% of the first contact portions are connected to the second contact portion.

Preferably, a maximum of ten of the first contact portions are connected to the second contact portion, more preferably a maximum of five first contact portions are connected to the second contact portions, and most preferably there is only one electrically conducting path, the one electrically conducting path electrically connecting only one first contact portion to the second contact portion.

Typically, the substrate is for mounting a wireless communication chip, such as a RF chip.

Typically, the substrate may comprise a number of mounting portions, each mounting portion having a number of first contact portions associated therewith.

BRIEF DESCRIPTION OF THE DRAWINGS

An example of a substrate for mounting a semiconductor chip in accordance with the invention will now be described with reference to the accompanying drawings, in which.

DETAILED DESCRIPTION

Figure 1:
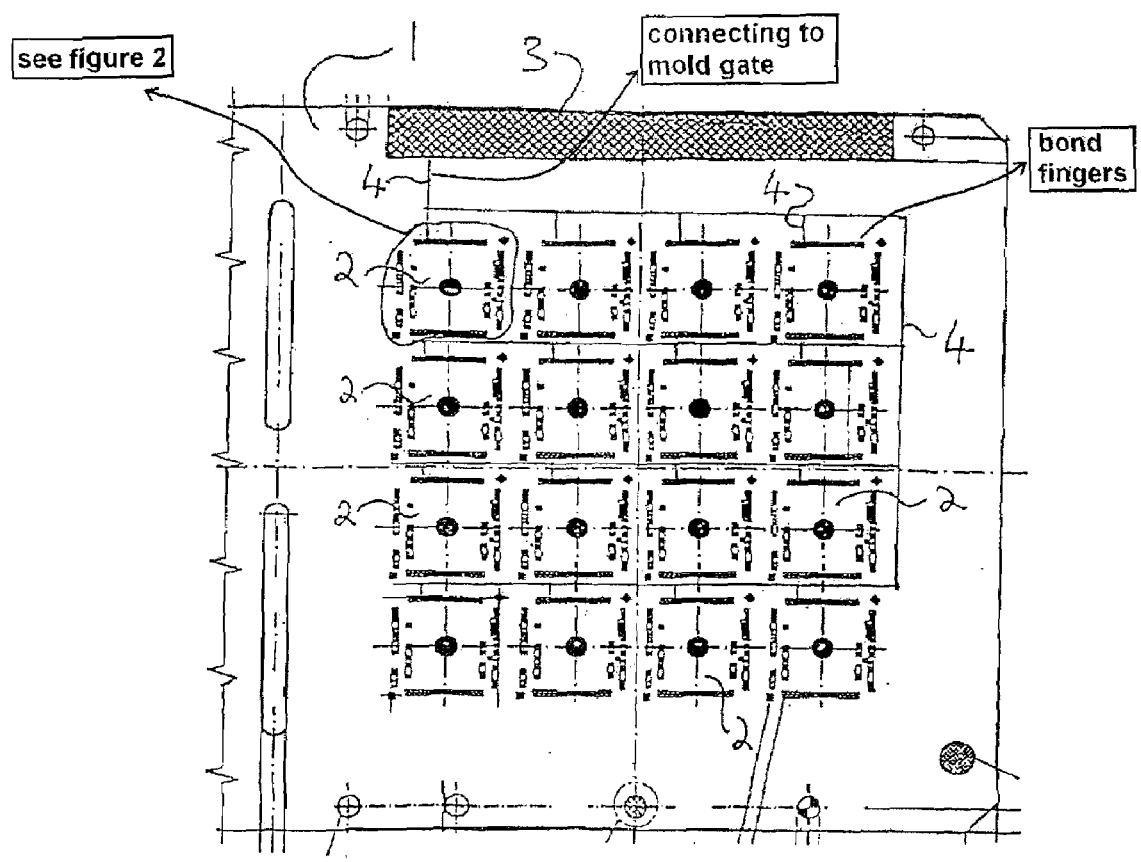
FIG. 1 is a plan view of a substrate showing a matrix arrangement of mounting areas for a semiconductor chip.
Figure 2:
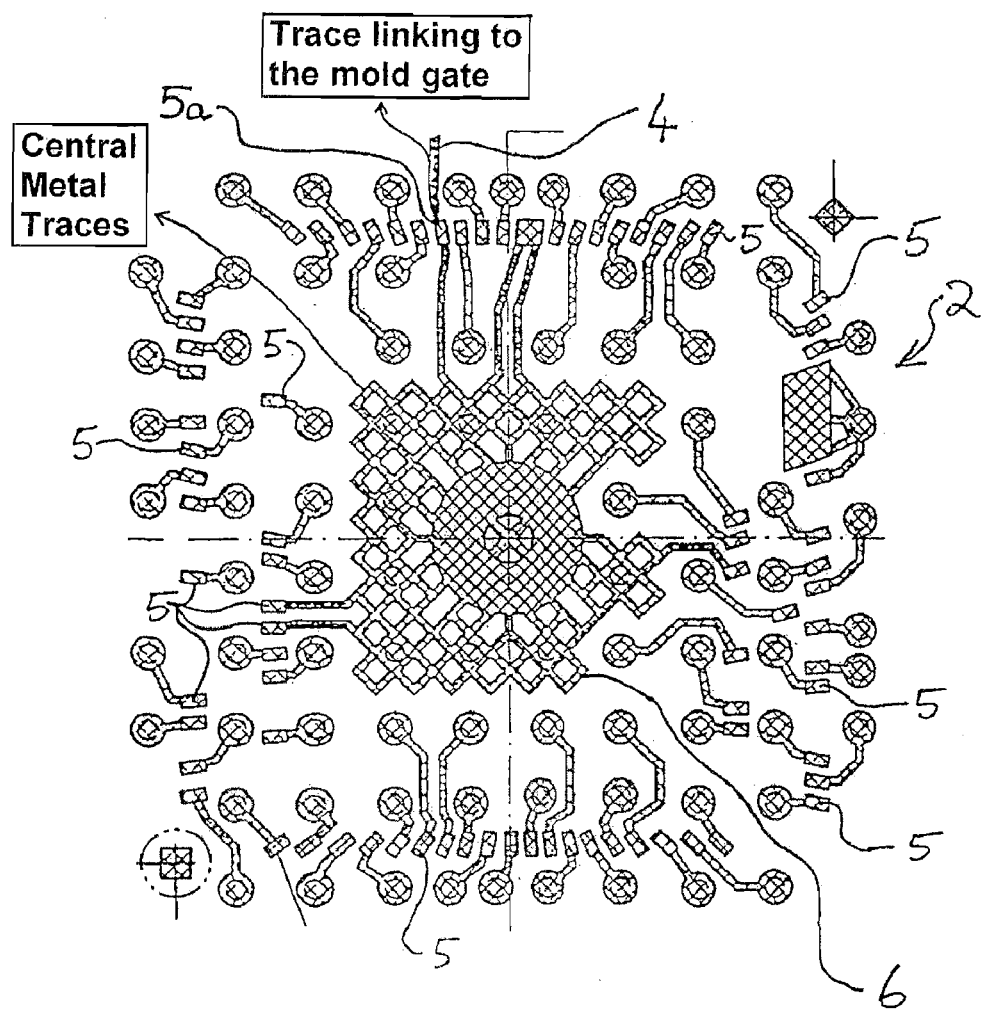
FIG. 2 is a detailed plan view of one of the semiconductor chip mounting areas.
Figure 3:
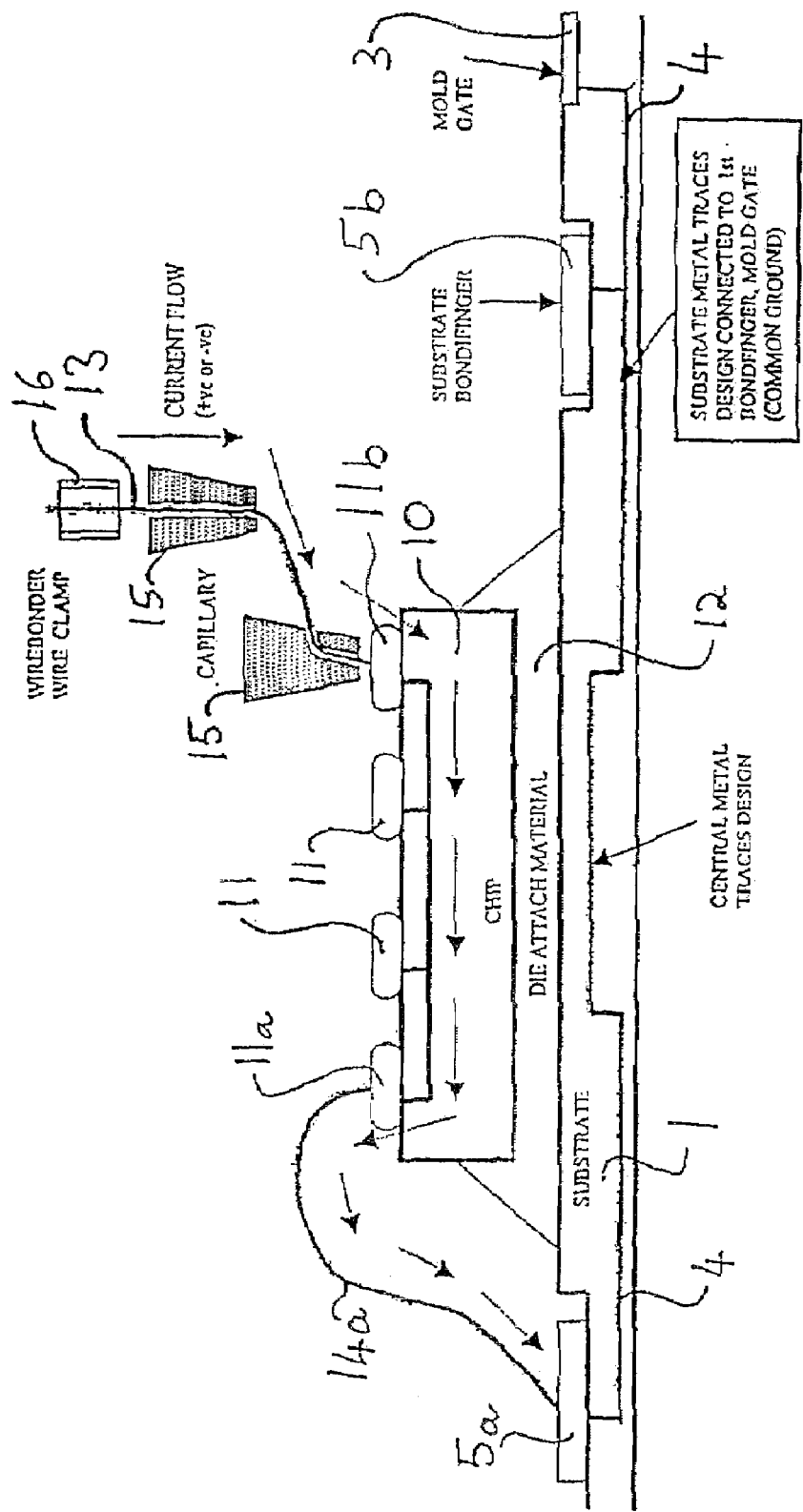
FIG. 3 is a schematic cross-sectional view showing wire bond testing during the wire bond operation for a semiconductor chip mounted on one of the mounting areas.

FIG. 1 shows a substrate 1 having a matrix array of mounting areas (or zones) 2. The substrate 1 is formed from an electrically insulating core material, which is typically a glass fibre and epoxy resin mixture. Common core materials are for example, BT or FR-4. Each of the zones 2 is adapted to have a semiconductor chip (or die) mounted thereon and includes a number of metal alloy pads (or bondfingers) 5 which are connected to input/output pads 11 of a semiconductor chip 10 mounted on the mounting zone 2 via electrically conducting wires (see FIG. 3). The arrangement of the bondfingers 5 in a zone 2 is shown in more detail in FIG. 2.

An electrically conducting contact portion (or mold gate) 3 is formed on an edge of the substrate 1. An electrically conducting trace 4 electrically connects the contact portion 3 to one bondfinger 5a in each of the mounting zones 2. The bondfinger 5a is also connected to the central metal traces which form a die attach area 6. The bondfinger 5a is the first bondfinger in the wire bonding process to be bonded to a bond pad 11 on a semiconductor chip 10 mounted in the mounting zone 2.

In use, the chip 10 is mounted on a die attach area 6 of the mounting zone 2 using a die attach material 12. The substrate 1 is then mounted in a wire bonder (not shown) and the contact portion 3 clamped in the wire bonder to form an electrical connection with the wire bonder. Firstly, the wire bonder bonds an end of a wire 13 to a first bond pad 11a on the chip 10 using the capillary 15. The capillary is then moved to the first bondfinger 5a and also bonds the wire 13 to the first bondfinger 5a. The wire bonder then clamps the wire 13 in a wire clamp 16 and lifts the capillary 15 away from the bondfinger 5a. If the wire 13 has been properly bonded to the bondfinger 5a, the wire 13 will break as the capillary is lifted leaving a wire bond 14a extending between the first bond pad 11a and the first bondfinger 5a.

The capillary 15 of the wire bonder then moves to a second bond pad 11b and bonds the free end of the wire 13 to the second bond pad 11b on the chip 10. After the bond is made and the capillary is lifted way from the bond pad 11b, the wire bonder injects a current into the wire 13. If the bond to the bond pad 11b is good, current will flow through the wire 13 into the bond pad 11b. As each of the bond pads 11 are electrically coupled to each other within the chip, typically via a transistor arrangement, the current will flow to the first bond pad 11a, through the first bond wire 14a, the first bondfinger 5a, the trace 4 to the contact portion 3 where the current is detected by the wire bonder which is electrically coupled to the contact portion 3. Hence, the wire bonder can detect whether the bond made on the second bond pad 11b is good. It should be noted that the electrical coupling of the bond pads 11 within the chip 10 is a common feature of most chip designs and is conventional.

After the bond to the second bond pad 11b has been tested, the wire bonder moves the capillary 15 to the second bondfinger 5a and bonds the wire 13 to the second bondfinger 5b. The wire bonder then clamps the wire 13 using the wire clamp 16 and lifts the wire clamp 16 and the capillary 15 away from the second bondfinger 5b. If the bond to the second bondfinger 5b is good, lifting the capillary 15 and wire clamp 16 away from the second bond finger 5b causes the wire 13 to break. Hence, if the wire bonder then injects a current into the wire 13, no current will be detected at the contact portion 3. However, if the bond to the second bondfinger 5b is not good and the wire does not break but the bond lifts off the bondfinger 5b when the wire clamp 16 and capillary 15 are lifted, a current injected into the wire 13 will be detected at the contact portion 3.

The same process is then repeated on each of the other wire bonds made on the other bond pads 11 and bondfingers 5 until all the necessary connections has been made between the bond pads 11 on the chip 10 and the bondfingers on the substrate 1.

Therefore, the invention has the advantage of enabling conventional wire bond testing to be performed on a semiconductor chip mounted on a substrate, without requiring an electrically conducting path (or trace) to extend from each bond finger to the contact portion 3, as only one trace is required to connect one bondfinger for each chip molded on substrate 1. This has the advantage that the performance of a wireless communication chip, such as a RF chip, is not likely to be adversely affected, as a single trace will in most cases have a negligible affect on the performance or operation of the chip.

The invention claimed is:

1. A substrate comprising a non-electrically conducting material for mounting a semiconductor chip, the substrate comprising a semiconductor chip mounting portion, a number of first electrically conducting contact portions formed on the surface of the material and associated with the mounting portion and adapted to be wire bonded to contacts of the semiconductor chip, a second electrically conducting contact portion formed on the surface of the material, the second electrically conducting contact portion being adapted to be coupled to testing equipment, and a number of electrically conducting paths formed on the surface of the material, the conducting paths electrically connecting the second electrically conducting contact portion to a minority of the first electrically conducting contact portions, the substrate including first electrically conducting contact portions which are not connected by a conducting path to an electrically conducting contact portion adapted to be coupled to testing equipment during a wire bonding operation performed on that first electrically conducting contact portion.

2. A substrate according to claim 1, wherein less than 10% of the first contact portions are connected to the second contact portion.

3. A substrate according to claim 1, wherein a maximum of ten of the first contact portions are connected to the second contact portion.

4. A substrate according to claim 3, wherein a maximum of five first contact portions are connected to the second contact portions.

5. A substrate according to claim 4, wherein there is only one electrically conducting path, the one electrically conducting path electrically connecting only one first contact portion to the second contact portion.

6. A substrate according to claim 1, wherein one of the first contact portions connected to the second contact portion is coupled to a ground contact on the substrate.

7. A substrate according to claim 6, wherein the ground contact is on the mounting portion.

8. A substrate according to claim 1, wherein the substrate is for mounting a wireless communication chip.

9. A substrate according to claim 1, wherein the substrate comprises a number of mounting portions, each mounting portion having a number of first contact portions associated therewith.

10. A method of electrically connecting an integrated circuit to a substrate comprising a non-electrically conducting material for mounting a semiconductor chip, the substrate comprising a semiconductor chip mounting portion, a number of first electrically conducting contact portions formed on the surface of the material and associated with the mounting portion, a second electrically conducting contact portion formed on the surface of the material, the second electrically conducting contact portion being adapted to be coupled to testing equipment, and a number of electrically conducting paths formed on the surface of the material, the conducting paths electrically connecting the second electrically conducting contact portion to a minority of the first electrically conducting contact portions, the method comprising:

coupling the second electrically conducting contact portion to said testing equipment;

mounting a semiconductor chip on the substrate;

performing a wire bonding operation on one of the first contact portions to which the second electrically conductive contact portion is connected by the conducting paths, while monitoring the current on the second electrically conductive contact portion; and performing a wire bonding operation on one of the first contact portions to which the second electrically conductive contact portion is not connected by the conducting paths, while monitoring the current on the second electrically conductive contact portion.

11. A method according to claim 10, wherein less than 10% of the first contact portions are connected to the second contact portion.

12. A method according to claim 10, wherein a maximum of ten of the first contact portions are connected to the second contact portion.

13. A method according to claim 12, wherein a maximum of five first contact portions are connected to the second contact portions.

14. A method according to claim 13, wherein there is only one electrically conducting path, the one electrically conducting path electrically connecting only one first contact portion to the second contact portion.

15. A method according to claim 10, wherein one of the first contact portions connected to the second contact portion is coupled to a ground contact on the substrate.

16. A method according to claim 15, wherein the ground contact is on the mounting portion.

17. A method according to claim 10, wherein a wireless communication chip is subsequently mounted on the substrate.

18. A method according to claim 10, wherein the substrate comprises a number of mounting portions, each mounting portion having a number of first contact portions associated therewith.

* * * * *